United States Patent [19]

Soltermann

[11] Patent Number: 4,773,051
[45] Date of Patent: Sep. 20, 1988

[54] CIRCUIT FOR SHAPING A SIGNAL PRODUCED BY A CONTACT

[75] Inventor: Bertrand Soltermann, Diesse, Switzerland

[73] Assignee: ETA SA Fabriques d'Ebauches, Granges, Switzerland

[21] Appl. No.: 127,302

[22] Filed: Dec. 2, 1987

[30] Foreign Application Priority Data

Dec. 3, 1986 [CH] Switzerland .................. 04822/86

[51] Int. Cl.$^4$ .............. G04C 9/00; G04B 29/00; H03K 17/56
[52] U.S. Cl. .................... 368/187; 368/321; 307/542.1
[58] Field of Search ................ 368/69–70, 368/185–188, 319–321; 307/247 A

[56] References Cited

U.S. PATENT DOCUMENTS

| | | | |
|---|---|---|---|
| 3,871,168 | 3/1975 | Maire et al. | 368/188 |
| 3,989,960 | 11/1976 | Kodama | 307/247 A |
| 4,196,584 | 4/1980 | Oda | 368/187 |
| 4,271,494 | 6/1981 | Miyazaki | 368/34 |
| 4,398,831 | 3/1983 | Fatton et al. | 368/76 |

FOREIGN PATENT DOCUMENTS

| | | |
|---|---|---|
| 2380581 | 9/1978 | France . |
| 4130 | 10/1976 | Switzerland . |
| 2005876 | 4/1979 | United Kingdom . |

*Primary Examiner*—Vit W. Miska
*Attorney, Agent, or Firm*—Pollock, Vande Sande & Priddy

[57] ABSTRACT

The circuit comprises a counter (13), a generator (11) that produces a reference signal (Sf) made up of pulses, and a two-input AND gate (10). One input of the AND gate is connected to the generator while the other input receives a signal (Sx) produced by a bouncing contact (X) as it switches from an open position to a closed position and vice versa. The output of the AND gate is connected to the clock input (C113) of the counter, which further has a reset input (R13) connected to the output of an inverter (14) whose input receives the signal produced by the contact.

Opening of the contact causes the reference signal to be blocked by the AND gate and the counter to be reset. Closure of the contact causes the AND gate to open to the reference signal whose pulses then increment the counter and the latter, upon its contents reaching a predetermined value, issues an output signal (S13) in the form of a pulse.

3 Claims, 1 Drawing Sheet

CIRCUIT FOR SHAPING A SIGNAL PRODUCED BY A CONTACT

BACKGROUND OF THE INVENTION

As is known, a mechanical contact, in particular in a watch, having an open position and a closed position, cannot switch from one position to the other without bouncing. Such bouncing of course adversely affects the signal produced by the contact.

The present invention relates to a circuit able to supply, in response to the signal issued by a contact troubled by bouncing, a well defined signal that is representative of the position of this contact.

Such circuits, also known as debouncing circuits, are well known. One such circuit comprises a one-shot flip-flop whose output issues a signal of given duration in response to the first closure (or first opening) of the contact. As a result, the contact's bounces immediately after the issuance of the signal no longer have any effect on the signal if the duration of the latter is greater than the switching time of the contact. This switching time varies inversely to the contact's operating frequency, i.e. the frequency of its changes of position.

This type of circuit is satisfactory in the more usual applications, i.e. when it is associated with a contact having a substantially constant switching time not affected by outside impacts. In other applications, such a circuit is liable to provide erroneous data.

For example, if the contact's switching time varies and exceeds the duration of the signal supplied by the circuit, the bouncing will still generate one or more undesirable signals, suppying false data. Such parasitic signals will also be generated by the circuit if the contact moves from one position to the other, while at rest, as a result, for instance, of accidental impacts of sufficient intensity. A further example may be when the contact's operating frequency is sufficiently high for the circuit's output signal to spread over several changes of position of the contact without detecting them. In such a case the circuit will also supply incorrect information.

Now, such extreme working conditions may, in particular, apply to certain contacts used in watches. This is for instance the case with analog electronic watches having a peripheral calendar and whose circuit receives a daily signal produced by a contact. This contact, which generally consists of a pair of flexible blades, is actuated once a day by a cam arranged on the drive shaft for the hours hand. In normal operation, the contact is closed by the cam once a day, the switching time between the instant when the contact blades start touching each other and the instant when they touch each other firmly being something of the order of 30 minutes. In the correction mode, however, the contact works far more frequently as it is actuated manually via the watch's crown, the latter then being kinematically linked to the drive shaft for the hours hand. The contact may, in this case, be actuated several times a minute, the interacting time between the blades being then reduced to a few seconds. Clearly, a one-shot flip-flop circuit cannot be used when the operating conditions vary within such limits.

Also, to save space and reduce the torque on the cam, it is preferred to use flexible blades that travel only over a short distance. This, of course, renders the contact particularly sensitive to impacts, against which a one-shot flip-flop is in no way protected.

In another constructional form, that is less sensitive to disturbances caused by impacts and which is described in Swiss Patent Application No. 4130/74, the debounce circuit essentially comprises a counter, able to count up to N, which issues, once filled, a signal at its output, and a generator which supplies a fixed frequency signal made up of a succession of pulses. When the contact is closed the pulses are applied to the counter's input, whereas while the contact is open the pulse flow is interrupted and the counter is reset.

Under these conditions and upon the contact switching from the open position to the closed position, the counter is reset whenever the contact opens because of bouncing or as a result of impacts. The pulse repetition frequency and the number N are furthermore so selected that during this period of instability on the part of the contact, the counter may not receive N consecutive pulses. Only after the final bounce, when the contact is closed with sufficient pressure for it no longer to be sensitive to shocks, will the counter, after having counted N pulses, issue a signal that is representative of the closed position of the contact.

Although the second circuit provides data about the contact's position that is more reliable than the first when the contact's operating frequency is fixed, both circuits suffer from the same deficiencies when this frequency varies to a large extent.

An object of the invention is to overcome this drawback by providing a circuit for shaping the signal produced by a contact, such signal being in either of first and second states, one state corresponding to the open position of the contact and the other state corresponding to the closed position thereof, said contact being liable to bounce as it switches from one position to the other, said circuit comprising:

means for producing a reference signal made up of a succession of pulses, the repitition frequency of the pulses being greater than the frequency with which the contact's position changes;

means for counting the pulses;

means for causing the pulses to be applied to the counting means when the signal from the contact is in its first state, and for causing such application of the pulses to be interrupted when the signal is in its second state;

means for resetting the counting means when the signal from the contact is in its second state; and means for producing an output signal when the number of pulses counted by said counting means reaches a predetermined value, wherein the means for producing the referece signal include means for rendering the repitition frequency of this signal's pulses representative of the frequency with which the contact's position changes.

BRIEF DESCRIPTION OF THE DRAWINGS

In the accompanying drawings, given by way of example.

Figure 1:
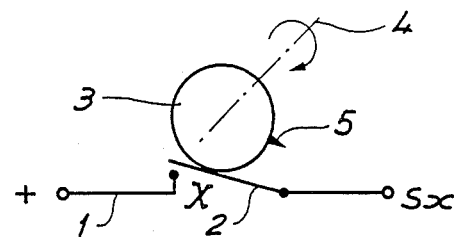
FIG. 1 is a view showing a conventional mechanical contact associated with a rotary control cam.

The conventional mechanical contact shown in FIG. 1, referenced X, comprises a stationary blade 1 and a movable blade 2 which do not touch each other at rest. The contact is operated by a cam 3 that is rotatably driven by a shaft 4 turning in one direction only and which is provided on its periphery with a tooth 5. As it moves, tooth 5 actuates blade 2 which then touches blade 1, causing contact X to move from an open position to a closed position.

Blade 1 is subjected to a positive voltage. Blade 2 then supplies a logic signal Sx which is low when the contact is open and high when the contact is closed. The same rule will be applied to the other contacts that will be described later.

Figure 3:
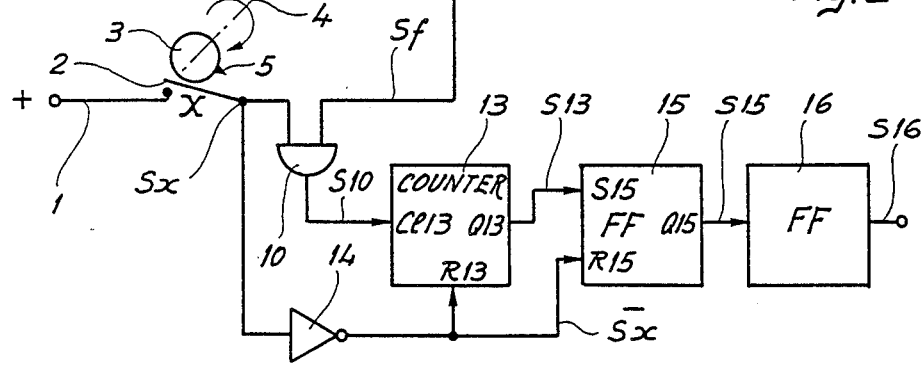
FIG. 3 is a graph showing the shape of some of the signals produced by the contact and the circuit.
Figure 3:
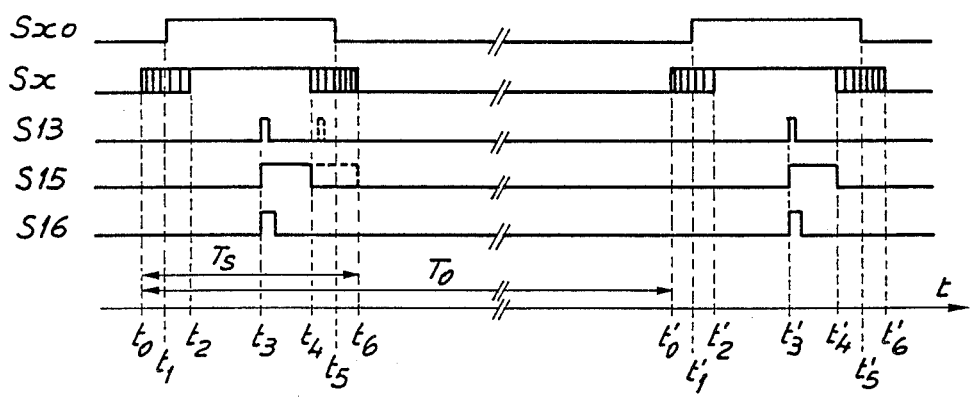

Ideally, contact X operates without bouncing to produce a signal Sxo which is shown in FIG. 3 with respect to time. The contact closes at instants $t_1$, $t'_1$ . . . and opens at instants $t_5$, $t'_5$ . . . Assuming cam 3 rotates at constant speed, time intervals $Tso = t_5 - t_1 = t'_5 - t'_1$ and $T_0 = t'_1 - t_1$ respectively define the duration of signal Sxo and its period.

In practice, the transition of contact X from its open position to its closed position and vice versa is not clear cut but involves a series of bounces around instants $t_1$, $t_5$, $t'_1$, $t'_5$ . . . The signal Sx that is produced is shown in FIG. 3. Thus, the first closure of contact X occurs at an instant $t_0$, slightly before $t_1$, and the definite closure occurs at an instant $t_2$, slightly after $t_1$. Similarly, the opening of contact X starts at an instant $t_4$ and ends at an instant $t_6$, these instants lying on opposite sides of $t_5$. The duration of signal $S_x$ in this case has a value $Ts = t_6 - t_0 = t'_6 - t'_0$ and is longer than Tso, whereas its period $t'_0 - t_0$ remains equal to $T_0$.

If cam 3 is driven by the hours shaft of a watch, then, typically, $Ts = 30$ minutes, $t_2 - t_0 = t_6 - t_4 = 9$ minutes, $t_4 - t_2 = 12$ minutes and, naturally, $T_0 = 12$ hours. The cam rotates under these conditions through an angle of 15 degrees between $t_1$ and $t_6$ and 6 degrees between $t_2$ and $t_4$. These values show that the period of instability represents a substantial part of the operative time of the contact. Sporadic closures of the contact may additionally occur, between instants $t_6$ and $t'_0$, due to external impacts.

Thus, as already pointed out, a one-shot flip-flop having a switching time slightly greater than $t_6 - t_0$, would enable bouncing occurring around instants $t_1$ and $t_5$ to be eliminated. On the other hand, by reacting to contact closures due to impacts, such a flip-flop would not be able to provide a reliable signal.

Figure 2:
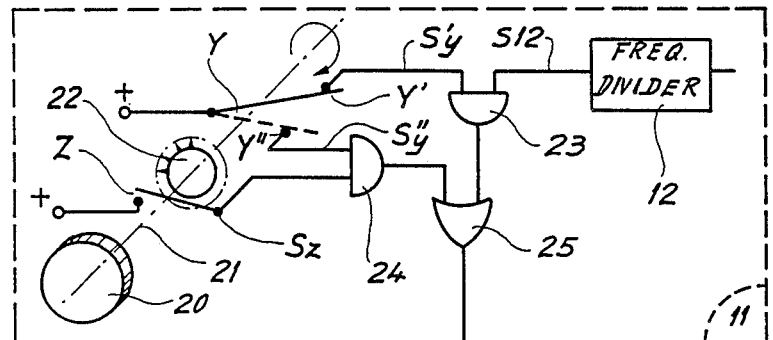
FIG. 2 is a diagram representing one form of embodiment of the circuit according to the invention.

That is why use is made in the present arrangement of a debounce circuit of the kind disclosed in Swiss Patent Application No. 4130/74, mentioned earlier. For a better understanding of the invention, this circuit, shown in FIG. 2, will now be described in detail. In FIG. 2 are to be seen contact X, which will be assumed to form part of an analog electronic watch, not shown, and cam 3 which is driven by hours-hand shaft 4 at the rate of one revolution per twelve hours. Signal Sx, produced by contact X, is applied to one input of a two-input AND gate 10, the other input receiving a reference signal Sf made up of a succession of short pulses. Signal Sf is produced by a pulse generator 11 which will be described in greater detail later. Generator 11 preferably includes the frequency divider 12 of the watch circuit, and issues on an output a signal S12 made up of minutes pulses. It will be assumed for the time being that signal Sf is taken directly from the output of divider 12 and that signals Sf and S12 are therefore identical.

The output of AND gate 10 issues a signal S10 which is applied to the clock input C113 of a three-bit counter 13. Counter 13 further has a resetting input R13 and an output Q13 which issues an overflow signal S13. This signal, shown in FIG. 3, contains for instance a short pulse which appears whenever counter 13 is full. Further, input R13 is connected to the output of an inverter 14 whose input is connected to contact X to receive signal Sx. Counter 13 is thus reset by a signal $\overline{Sx}$, the reverse of signal Sx.

The FIG. 2 circuit operates as follows. As long as contact X is open, signal Sx is low. Signal Sx then is blocked by AND gate 10 and counter 13 is reset, signal $\overline{Sx}$ being high. Cam 3, during rotation, closes contact X at instant $t_0$ with tooth 5, causing signal Sx to go high and signal $\overline{Sx}$ to go low. AND gate 10 then opens and counter 13 starts counting the minutes pulses of signal Sf.

The first time contact X opens as a result of bouncing, counter 13 is reset and counting stops, to start again from zero with the next closure of contact X. This sequence may recur several times between instants $t_0$ and $t_2$. The capacity of counter 13 being 3 bits, it can only count up to 7. It will be assumed that, during the firming period of the contact, there will be enough bouncing for this number never to be reached.

From instant $t_2$, contact X is supposed to be closed and no longer subject to bouncing. The counting of the pulses of signal Sf can then carry on without interruption for 7 minutes, i.e. till instant $t_3$. Since the contents of counter 13 then reaches its maximum value, output Q13 produces a short pulse which can be found in signal S13, indicating that contact X is closed. Counting carries on for 5 more minutes till instant $t_4$, when counter 13 is reset by the first opening of contact X, before reaching maximum capacity a second time. Finally, between instant $t_4$ and instant $t_6$, when contact X is in the opening phase, exactly the same situation occurs as between instants $t_0$ and $t_1$. It will also be assumed here that there will be sufficient bouncing for counter 13 never to reach maximum capacity.

Twelve hours after $t_0$, i.e. at instant $t'_0$, contact X starts the same cycle over again and its closure will be identified as before by a pulse of signal S13 occurring at instant $t'_3$.

For the circuit just described to issue an output signal, contact X must remain closed for 7 consecutive minutes. It thus provides very effective protection against brief contact closures caused by outside impacts between instants $t_6$ and $t'_0$.

It was assumed, when describing the operation of the circuit, that contact X opens at instant $t_4$, i.e. 5 minutes after counter 13 reaches full capacity and produces a pulse at instant $t_3$. If the opening of contact X is more than 2 minutes late, with counter 13 continuing to be incremented by signal Sf, counter 13 will reach once again maximum capacity before instant $t_6$ and produce another pulse, shown by a broken line in FIG. 3, between instants $t_4$ and $t_5$. As this second pulse is not produced by a change in the position of contact X, it does not have the same significance as the previous pulse and must not be confused therewith.

To avoid such confusion, signal S13 is preferably applied to the set input S15 of a bistable flip-flop whose reset input R15 receives signal $\overline{Sx}$. The output Q15 of flip-flop 15 then supplies a signal S15 which is not influenced by the second pulse of counter 13 since flop-flop 15 is reset by the bouncing of contact X between instants $t_0$ and $t_2$. Flip-flop 15 is then set at instant $t_3$ by the pulse of signal S13, causing signal S15 to go from low to high. The next pulse of signal S13 merely confirms the logic state of flip-flop 15. Signal S15 then remains high until contact X again opens, i.e. at the latest at instant $t_6$. The two pulses of signal S13 are thus converted into a single pulse of signal S15. This pulse starts at instant $t_3$ but its duration is ill defined. A one-shot flip-flop 16, connected to the output of flip-flop 15, overcomes this drawback by supplying a signal S16 made up of pulses of constant duration, corresponding to the pulses of signal S15.

The operation of the circuit has been described with cam 3 rotating at constant speed, at the rate of one revolution every 12 hours. Clearly, if the speed were to change, the operating conditions of the circuit could become incompatible with correct operation. For example, if the cam's rotational speed were to double, the times given in FIG. 3 would all have to be divided by two whereas signal Sf would continue to be made up of minutes pulses. The contents of counter 13, in the circumstances, would never reach maximum capacity since, after 7 minutes, contact X would already have started to open, thereby resetting counter 13 before being able to produce an output signal But if at the same time, the frequency of signal Sf were doubled such as to issue two pulses per minute, the operation of the circuit would again become normal. This is because the time interval $t_4-t_2$ would now be 6 minutes, instead of 12, and though it still would amount to an angle of 6 degrees on cam 3, signal Sf, with its doubled frequency, would still supply 12 pulses over these 6 degrees as before.

Thus, by tying the frequency of signal Sf to the rotational speed of cam 3, i.e. to the operating speed of contact X, by means known per se, the circuit issues a correct output signal even when the operating frequency varies to a large extent.

Contact X, which is controlled by the shaft of the hours hand via cam 3, is a kind of contact able to work at highly differing frequencies.

The frequency considered so far, i.e. one closure per 12 hours, is a low operating frequency that corresponds to the normal working mode of a watch. In order to manually correct the date of the calendar, the watch must be set in a correction mode in which contact X operates at a far higher frequency.

Switching from one mode to the other is done with a crown 20 mounted on a pivotal stem 21 able to occupy, along with the crown, two axial positions. The first position, that shown in FIG. 2, corresponds to the normal working mode of the watch; the second, arrived at by pulling on the crown, corresponds to the date correction mode.

In this second position, crown 20 is connected, via a gear-train not shown, to the hours hand shaft to rotate it, along with contact X, at high speed.

The axial position of crown 20 is identified by a reversing contact Y that is controlled by axial displacement of pivotal stem 21 and is able to take up two angular positions, referenced Y' and Y", the first corresponding to the normal mode and the second to the correction mode. Stem 21 also fixedly carries a cam 22 having 12 teeth which successively close, in either mode, a contact Z when crown 20 is being manually rotated.

Contact Y produces a pair of signals, referenced S'y and S"y. Signal S'y is high and signal S"y is low when contact Y is in position Y'. The logic levels are reversed in position Y". Moreover, contact Z produces a signal Sz which goes high whenever contact Z closes.

A two-input AND gate 23 receives signals S12 and S'y, and another two-input AND gate 24 receives signals Sz and S"y. The outputs of AND gates 23 and 34 are connected to the inputs of a two-input OR gate 25, the output of gate 25 supplying reference signal Sf.

The elements referenced 12, 20 to 25, Y and Z form pulse generator 11 which operates as follows.

In the normal mode, with contact Y in position Y', signal S'y is high and signal S"y is low. AND gate 23 then lets signal S12 through whereas AND gate 24 blocks signal Sz. Signal Sf therefore is, in this instance, identical to signal S12, as was assumed when describing the operation of the circuit associated with contact X.

In the correction mode, however, signal Sf becomes identical to signal Sz since, in this case, AND gate 23 blocks signal S12 whereas AND gate 24 lets signal Sz through. In this mode, a mechanical linkage, not shown, is also provided between stems 4 and 21 to enable the hours hand to be driven by crown 20. It is preferred to select a linkage such that one revolution of crown 20 produces a 6 degree rotation of stem 4, corresponding to a movement of 12 minutes by the hours hand. Since cam 22 has 12 teeth, signal Sz, and hence signal Sf, will then contain 12 pulses per revolution of crown 20, i.e. per 12 minutes of movement by the hours hand, exactly as in the normal mode.

However, the 6 degrees of rotation by stem 4 are completed in 12 minutes in the normal mode, whereas in the correction mode this angle may be covered in 1 second, i.e. 720 times faster. The operating frequency of the contact obviously varies in the same ratio.

Various modifications may be made to the above described and illustrated circuit within the scope of the appended claims. For instance, the circuit may be adapted, by resorting to a forward-backward counter and to known means for detecting the crown's direction of rotation, to a contact X operated by a cam able to rotate in both directions whereby date setting may also be performed in both directions.

What is claimed is:

1. A circuit for shaping a signal produced by a contact, said signal being in either of first and second states, one state corresponding to the open position of the contact and the other state corresponding to the closed state thereof, said contact being liable to bounce as it switches from one position to the other, said circuit comprising:
    means for producing a reference signal made up of a succession of pulses, the repetition frequency of the pulses being greater than the frequency with which the contact's position changes;
    means for counting said pulses;
    means for causing said pulses to be applied to the counting means when the signal from the contact is in its first state, and for causing such application of the pulses to be interrupted when said signal is in its second state;
    means for resetting the counting means when the signal from the contact is in its second state; and
    means for producing an output signal when the number of pulses counted by the counting means reaches a predetermined value, wherein the means for producing said reference signal include means for rendering the repetition frequency of this signal's pulses representative of the frequency with which said contact's position changes.

2. A circuit as in claim 1, wherein said contact is controlled by a first rotary cam and the means for producing said reference signal include a second rotary cam, that is kinematically associated for rotation with the first cam, and a detector contact that is controlled by the second cam and arranged to supply said reference signal.

3. A circuit as in claim 2, in use in an analog electronic watch having a rotatable time-setting crown, wherein said first and second cams are rotatably driven by said crown while the watch is time-set.

* * * * *